(12) United States Patent
Sekino

(10) Patent No.: US 6,903,956 B2
(45) Date of Patent: Jun. 7, 2005

(54) SEMICONDUCTOR MEMORY DEVICE

(75) Inventor: Yoshimasa Sekino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/670,220

(22) Filed: Sep. 26, 2003

(65) Prior Publication Data

US 2004/0062113 A1 Apr. 1, 2004

Related U.S. Application Data

(60) Provisional application No. 60/413,781, filed on Sep. 27, 2002.

(51) Int. Cl.[7] .................................................. G11C 5/06
(52) U.S. Cl. ................ 365/63; 365/230.03; 365/230.06
(58) Field of Search ............................. 365/63, 230.03, 365/230.06

(56) References Cited

U.S. PATENT DOCUMENTS 4,636,982 A * 1/1987 Takemae et al. ............ 365/149
5,369,619 A * 11/1994 Ohba .......................... 365/63
6,388,937 B2 * 5/2002 Takeyama et al. ...... 365/230.03

* cited by examiner

*Primary Examiner*—Huan Hoang
(74) *Attorney, Agent, or Firm*—Nixon Peabody LLP; Donald R. Studebaker

(57) ABSTRACT

One semiconductor memory device according to the invention comprises a plurality of memory blocks, signal lines respectively connected to the plurality of memory blocks, and a control circuit connected to the signal lines, and the control circuit includes selection signal generator circuits for generating selection signals for selecting one memory block of the plurality of memory blocks by externally input address signals and for outputting the selection signals to the signal lines, and the lengths of the signal lines from the selection signal generator circuits to the respective memory blocks are longer in proportion to distances from the control circuit to the memory blocks. Thereby, parasitic load capacitances of the signal lines connected to the respective memory blocks in the wiring direction can be reduced, and the semiconductor memory device that operates with lower current consumption can be provided.

22 Claims, 5 Drawing Sheets

US 6,903,956 B2

SEMICONDUCTOR MEMORY DEVICE

This application claims benefit of 60/413,781 filed Sep. 27, 2002.

BACKGROUND OF THE INVENTION

The present invention relates to a semiconductor memory device, and particularly, to a semiconductor memory device having divided and arranged memory blocks and memory block decoder circuits for selecting one memory block that includes a desired memory cell from the plural memory blocks.

An example of a conventional decoder circuit is shown in FIG. 1. As shown in FIG. 1, in the conventional decoding system, first, address signals AiIN and AjIN externally input to a control circuit block 101 are input to an inversion signal generator circuit 103 that is constituted by a circuit including inverters 103$i$ and 103$j$. The inversion signal generator circuit 103 outputs address signals /AiIN and /AjIN generated from the address signals AiIN and AjIN, and the address signals AiIN and AjiN. The address signals AiIN and AjIN and the address signals AiIN and AjIN are input to a signal driver circuit 104 that is constituted by inverters 105, 106, 107, and 108. The signal driver circuit 104 drives address signals Ai, /Ai, Aj, and /Aj, and transmits the address signals Ai, /Ai, Aj, and /Aj to a desired memory block of plural memory blocks 110, 120, 130, and 140 that are provided in a memory cell area 102. The control circuit block 101 in the conventional semiconductor memory device is constituted by these inversion signal generator circuit 103 and signal driver circuit 104 included therein.

The conventional memory blocks 110, 120, 130, and 140 include decoder circuits BSD with the address signals Ai, /Ai, Aj, and /Aj output from the control circuit block 101 as input to output memory block selection signals for selecting a desired memory block, and memory cell arrays MCA in which plural memory cells are arranged in a matrix form. The decoder circuits BSD and the memory cell arrays MCA in the respective memory blocks are connected by selection signal lines BS 11, BS 12, BS 13, and BS 14 for transmitting the output of the decoder circuits BSD to the memory cell arrays MCA, and the respective decoder circuits BSD and memory cell arrays MCA are disposed apart at nearly the same distance from each other. Conventionally, the decoder circuit BSD that outputs the memory block selection signal for selecting a memory block in which a desired memory block array MCA is provided is constituted by at least an NAND 111 and an inverter 112, for example. That is, two of the four address signals are selectively connected to the decoder circuit included in each memory block.

When selecting a memory block, since levels of one of Ai and /Ai and one of Aj and /Aj are "H", respectively, one memory block selection signal becomes "H" depending on their combinations, and the corresponding memory block is selected. For example, in the case where both of the address signals AiIN. and AjIN are "L", the address signals /Ai and /Aj assume "H", thereby the level of the block selection signal line BS 14 becomes "H" and the memory block 140 are in a selected state. Then, when both of the address signals AiIN and AjIN turn from "L" to "H", the address signals /Ai and /Aj turn from "H" to "L" and the block selection signal BS 14 turns from "H" to "L", thereby the memory block 140 comes to assume an unselected state from the selected state. At this time, the address signals Ai and Aj turn from "L" to "H", and the level of the block selection signal line BS 11 turns from "L" to "H", thereby the memory block 110 comes to assume the selected state from the unselected state.

SUMMARY OF THE INVENTION

FIG. 2 is a view showing a layout of transistors that constitute the signal driver circuit 104 included in the control circuit block 101 in the decoder circuit in the conventional semiconductor memory device.

As shown in FIG. 1, in the conventional decoder circuits, for example, the address signal Ai input to the decoder circuit BSD 11 of the memory block 110 serves as not only an input signal to the decoder circuit BSD 11 of the memory block 110 but also an input signal to the decoder circuit BSD 13 of the memory block 130.

That is, the internal wiring that provides the address signal Ai is connected to both the memory block 110 and the memory block 130, and extendingly disposed to the memory block 130 that is apart from the control circuit block 101. Further, inverters 105$a$ and 105$b$ of the signal driver circuit 104 are made in dimensions for ensuring sufficient driving capability of transmitting the address signal Ai to the decoder circuit BSD 13, because there emerges a need for transmitting the address signal Ai to the decoder circuit BSD 13 of the memory block 130 that is apart farther from the control circuit block 101 than the memory block 110.

Similarly, as for the internal wiring that provides other address signals /Ai, Aj, and /Aj, and the inverters 106, 107, and 108 that drive the address signals /Ai, Aj, and /Aj, the internal wiring is extendingly disposed to the memory blocks that are apart farther from the control circuit block 101, and made in dimensions for ensuring sufficient driving capability of transmitting the address signals /Ai, Aj, and /Aj to the decoder circuits BSD 14, BSD 12, and BSD 14 that are apart farther from the control circuit block 101.

That is, in the conventional semiconductor memory device, since there is a need to selectively connect two address signals of the four address signals to the memory block selector circuits (decoder circuits BSD 11, BSD 12, BSD 13, and BSD 14) provided in the respective memory blocks, the inverters 105, 106, 107, and 108 that constitute the signal driver circuit 104 within the control circuit block 101 are constructed in sizes capable of transmitting the signals to the memory blocks disposed in positions apart farther from the control circuit block 101.

However, in such conventional semiconductor memory device, since the address signals Ai, /Ai, Aj, and /Aj generated in the control circuit block 101 are supplied to the respective memory cell blocks, as a result, wiring lengths of the respective address signal lines will be increased. Thereby, the problem of increase in capacitance between the wiring of the adjacent address signal lines, i.e., parasitic capacitance arises in the current semiconductor memory device in which miniaturization is proceeding. In addition, in the conventional memory block selecting method, since operating one address signal results in operating two address signals, the problem of increase in number of the operating signal lines per one operation also arises. The increase in parasitic capacitance and the increase in number of the operating signal lines per one operation cause increase in current consumption.

In order to solve the above described problems, one semiconductor memory device according to the invention comprises a plurality of memory blocks, signal lines respectively connected to the plurality of memory blocks, and a control circuit connected to the signal lines, and the control circuit includes selection signal generator circuits for generating selection signals for selecting one memory block of the plurality of memory blocks by externally input address signals and for outputting the selection signals to the signal lines, and the lengths of the signal lines from the selection signal generator circuits to the respective memory blocks are longer in proportion to distances from the control circuit to the memory blocks.

In addition, another semiconductor memory device according to the invention comprises a plurality of memory blocks disposed along a first direction, signal lines respectively connected to the plurality of memory blocks, and a control circuit disposed apart from a plurality of memory cells along the first direction and connected to the signal lines, and the control circuit includes selection signal generator circuits for generating selection signals for selecting one memory block of the plurality of memory blocks by externally input address signals and for outputting the selection signals to the signal lines, and the lengths of the signal lines from the selection signal generator circuits to the respective memory blocks are longer in proportion to distances from the control circuit to the memory blocks.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENT

Figure 1:
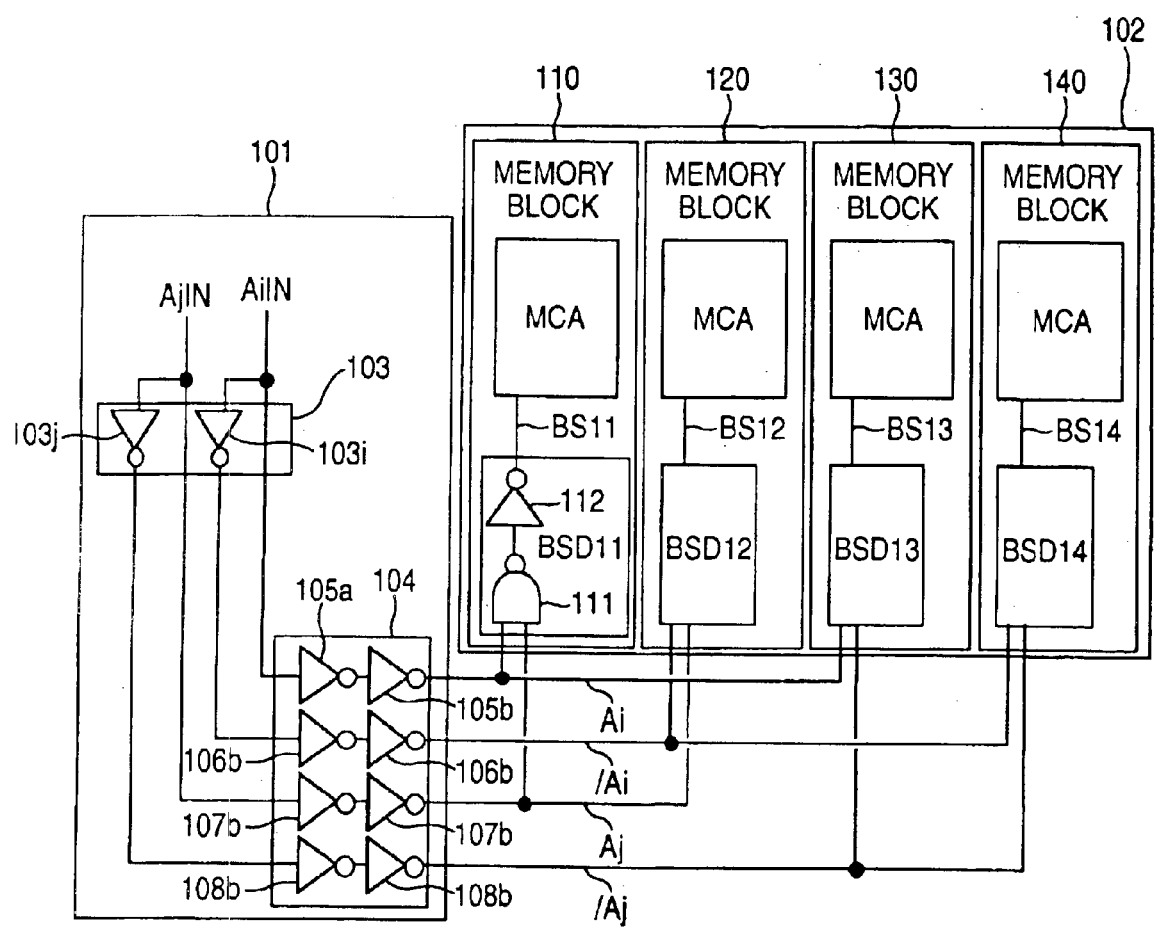
FIG. 1 is a circuitry diagram in a conventional semiconductor memory device.
Figure 2:
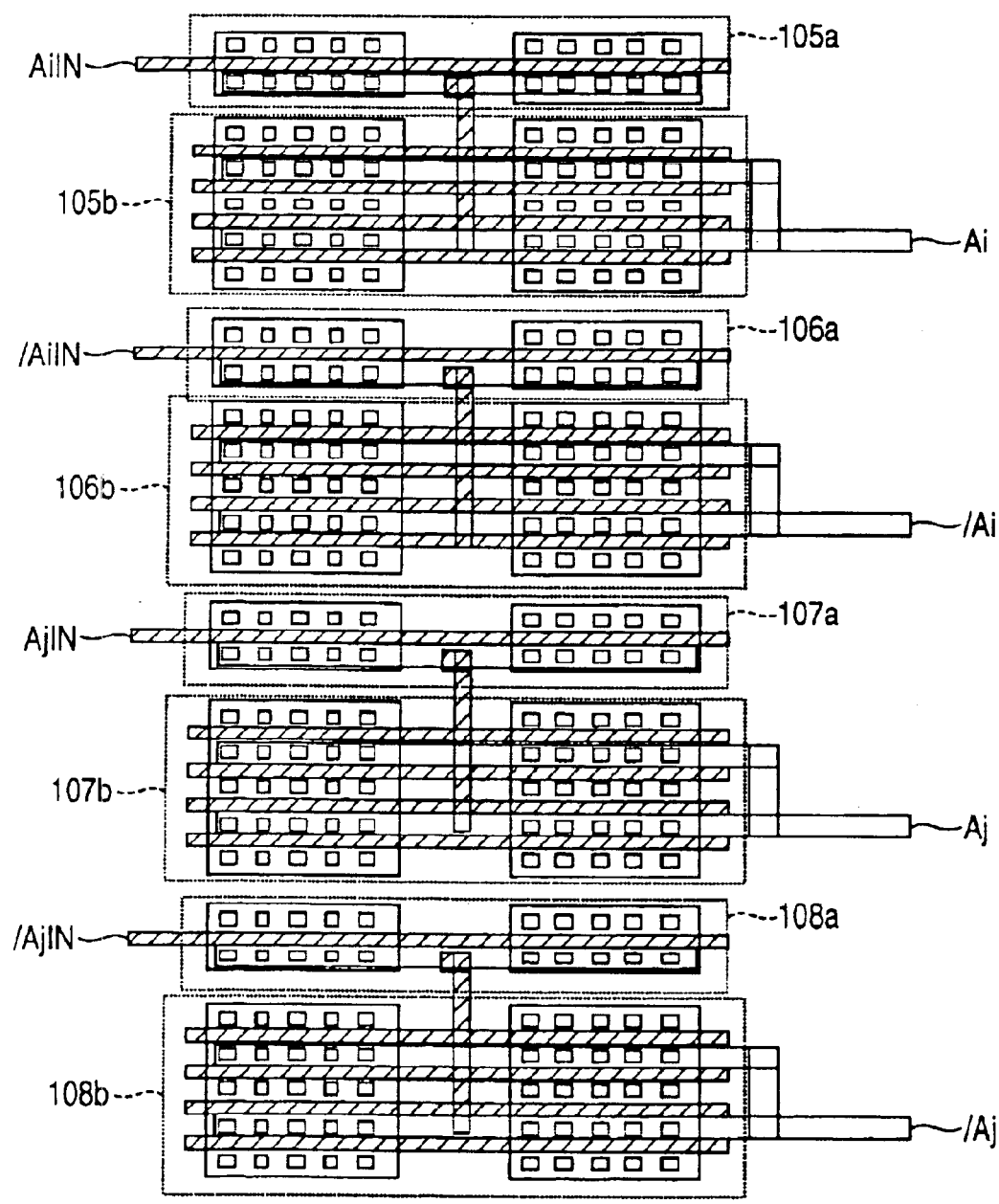
FIG. 2 is a layout diagram of a signal driver circuit included in a conventional control circuit block.

Hereinafter, a first embodiment of the invention will be described in detail by referring to the drawings.

Figure 3:
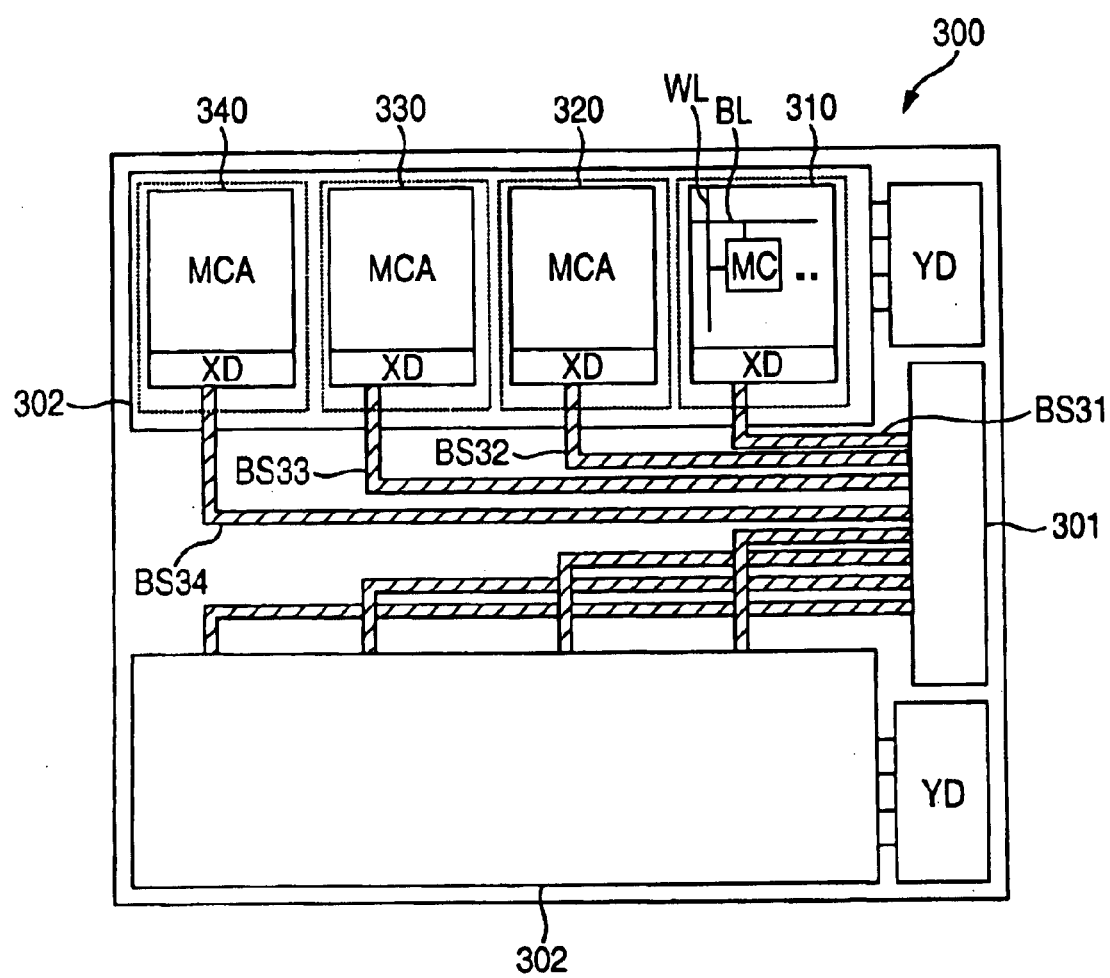
FIG. 3 is a plan view of a semiconductor memory device in a first embodiment.
Figure 4:
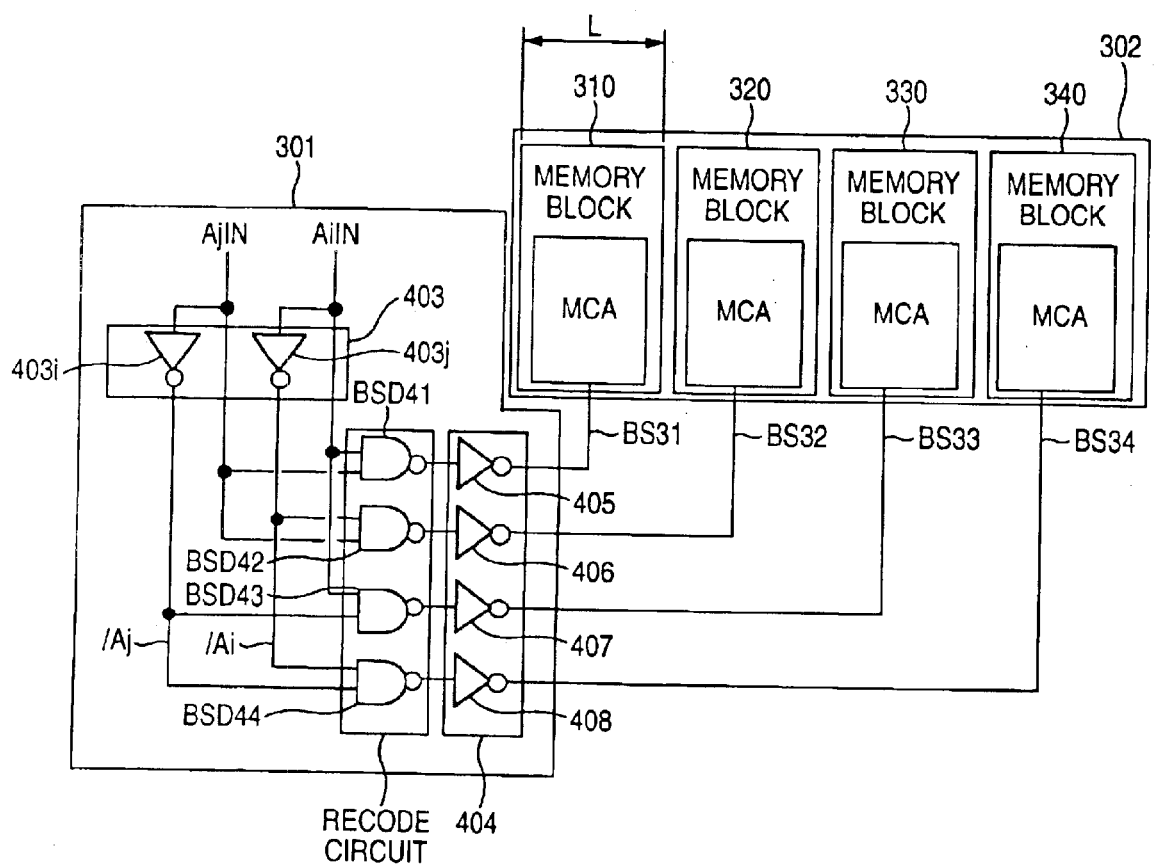
FIG. 4 is a circuitry diagram in the semiconductor memory device in the first embodiment.
Figure 5:
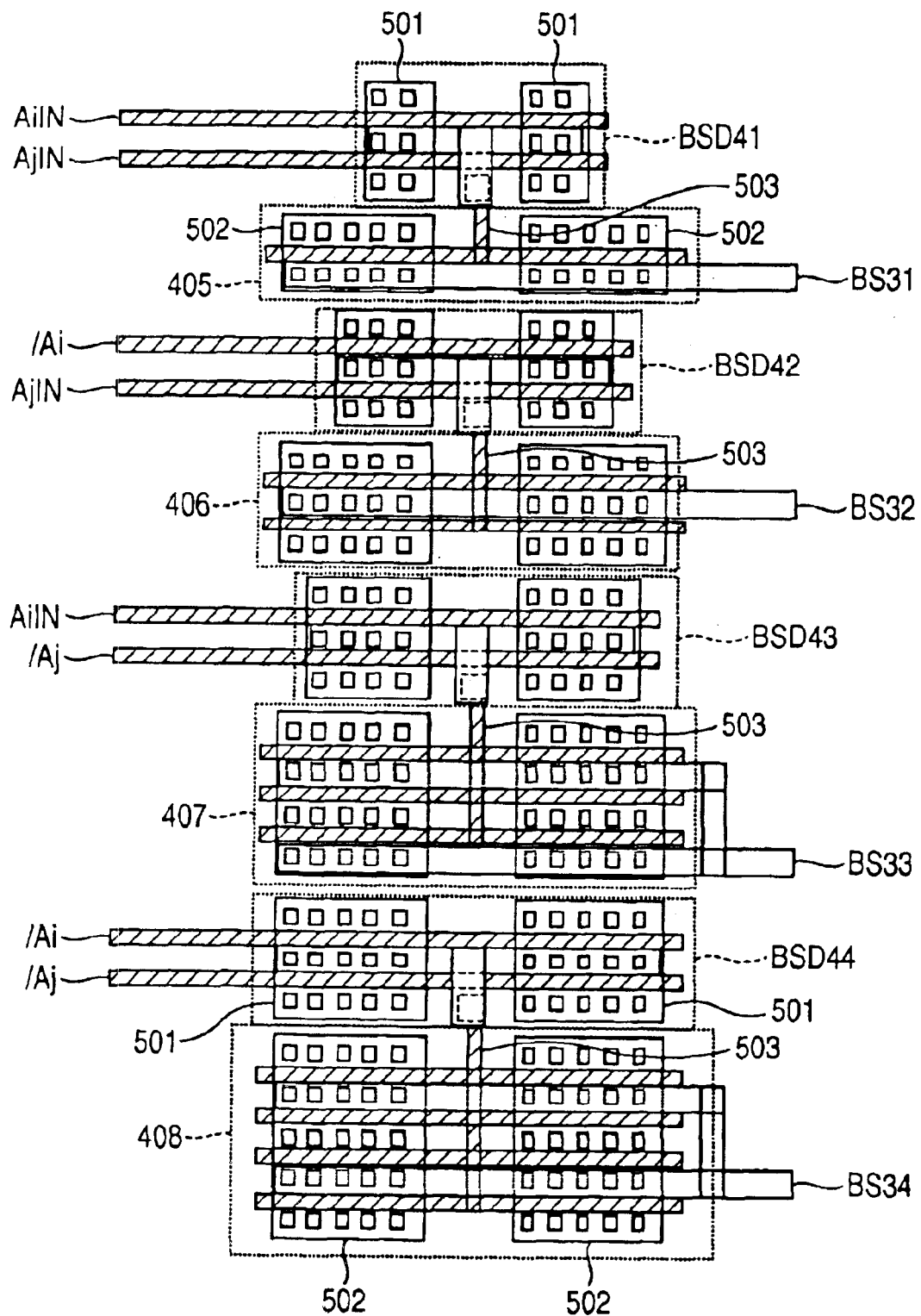
FIG. 5 is a layout diagram of a signal driver circuit and decoder circuits for generating memory block selection signals, which are included in a control circuit block in the first embodiment.

FIG. 3 is a plan view of a semiconductor memory device in the first embodiment of the invention, FIG. 4 is a view for explanation of an example of circuitry of the semiconductor memory device in the embodiment, which is shown in FIG. 3. Further, FIG. 5 is a view showing a layout of transistors that constitute a decoder circuit for generating memory block selection signals for selecting a memory block and a signal driver circuit for driving the memory block selection signals of circuits included in a control circuit block in the first embodiment.

As shown in FIG. 3, a semiconductor memory device 300 in the first embodiment has two memory cell areas 302, for example. In each memory cell area 302, there provided memory blocks 310, 320, 330, and 340 that are constituted by memory cell arrays MCA in which plural memory cells MC are arrayed and X decoders XD for driving word lines WL to which the memory cells MC are connected, for example, when selecting one memory cell from the plural memory cells that constitute the memory cell arrays MCA. In the embodiment, the plural memory blocks 310, 320, 330, and 340 provided in the memory cell area 302 are disposed apart from one another along a first direction (a direction along which the plural word lines WL are arranged in the embodiment). Further, in the semiconductor memory device 300 in the first embodiment, there provided a Y decoder YD adjacent to the memory area 302 along the first direction, which selects a bit line BL to which a desired memory cell MC is connected and drives column lines connected to a data bus corresponding to the bit line BL, when selecting one memory cell from the memory cell array MCA.

Further, in the semiconductor memory device 300 in the first embodiment, a control circuit block 301 is provided adjacent to the memory area 302 along the first direction. Within the control circuit block 301, for example, there included a decoder circuit etc. that generates memory block selection signals for selecting a memory block including a desired memory cell array from the plural memory blocks 310, 320, 330, and 340 provided in the memory cell area 302 in operation. The respective memory block selection signals generated by the decoder circuits of the control circuit block 301 are provided to the respective memory blocks via memory block selection signal lines BS 31, BS 32, BS 33, and BS 34 that are connected to the memory blocks 310, 320, 330, and 340, respectively.

Next, using FIG. 4, the circuitry of the semiconductor memory device in the embodiment and a memory block selecting method will be described in detail.

As shown in FIG. 4, in the semiconductor memory device in the first embodiment, address signals AiIN and AjIN externally input to the control circuit block 301 are input to an inversion signal generator circuit 403 that is constituted by inverters 403i and 403j. The inversion signal generator circuit 403 outputs address signals AiIN and AjIN, an address signal /Ai generated from the address signal Ai, and an address signal /AiIN generated from the address signal AjIN, respectively.

The address signals AiIN and AjIN and the address signals /Ai and /Aj are input to decoder circuits BSD 41, BSD 42, BSD 43, and BSD 44 constituted by NAND circuits, for example. The outputs from the respective decoder circuits are input to a signal driver circuit 404 constituted by plural inverters 405, 406, 407, and 408, and thereby, the memory block selection signals generated in the decoder circuits BSD 41, BSD 42, BSD 43, and BSD 44 are transmitted to the respective memory blocks 310, 320, 330, and 340.

Described in detail, the address signals AiIN and AjIN are input to the decoder circuit BSD 41 constituted by an NAND circuit, and its output is input to the inverter 405 that constitutes the signal driver circuit 404. The inverter 405 drives the block selection signal line BS 31 and selects the memory block 310. The address signal/Ai and the address signal AjIN are input to the decoder circuit BSD 42 constituted by an NAND circuit, and its output is input to the inverter 406 that constitutes the signal driver circuit 404. The inverter 406 drives the block selection signal line BS 32 and selects the memory block 320. The address signal AiIN and the address signal /Aj are input to the decoder circuit BSD 43 constituted by an NAND circuit, and its output is input to the inverter 407 that constitutes the signal driver circuit 404. The inverter 407 drives the block selection signal line BS 33 and selects the memory block 330. The address signals /Ai and /Aj are input to the decoder circuit BSD 44 constituted by an NAND circuit, and its output is input to the inverter 408 that constitutes the signal driver circuit 404. The inverter 408 drives the block selection signal line BS 34 and selects the memory block 340.

In the embodiment, the control circuit block 301 is constituted by the inversion signal generator circuit 403, the signal driver circuit 404, and the decoder circuits BSD 41, BSD 42, BSD 43, and BSD 44.

The operation of the semiconductor memory device in the embodiment will be described by taking the case where both of the address signals AiIN and AjIN turn from "L" to "H" for example.

First, when both of the levels of the address signals AiIN and AjIN are "L", since the levels of the address signals /Ai and /Aj are "H" and the output of the decoder circuit BSD 44 is "L", the level of the block selection signal line BS 34 is "H". Thereby, the memory block 340 is selected. Then, when both of the levels of the address signals AiIN and AjIN turn from "L" to "H", since the level of the address signals /Ai and /Aj turn to "L" and the output of the decoder circuit BSD 44 turns to "H", the level of the block selection signal line BS 34 turns to "L". Thereby, the memory block 340 comes to assume an unselected state from a selected state. Simultaneously, the output of the decoder circuit BSD 41 turns to "L" and the level of the block selection signal line BS 31 turns to "H", thereby the memory block 310 comes to assume the selected state from the unselected state. At this time, since the outputs of the decoder circuits BSD 42 and BSD 43 maintain "H", the levels of the block selection signal lines BS 32 and BS 33 remain at "L", and the memory block 320 and 330 maintain the unselected state.

Further, using FIG. 5, the layout of the signal driver circuit and the decoder circuits that generate the memory block selection signals, which are included in the control circuit block of the semiconductor memory device in the embodiment, will be described.

As shown in FIG. 5, in the signal driver circuit and the decoder circuits in the embodiment, an active area 501 of the decoder circuit, which is constituted by an NAND circuit realized by two NMOS transistors connected to each other in series and two PMOS transistors that are connected to one of the series-connected NMOS transistors and connected to each other in parallel, and an active area 502 of the inverter, which constitutes the signal driver circuit 404 and is constituted by the PMOS transistor and the NMOS transistor, are disposed in positions adjacent to each other, and the respective active areas are electrically connected by wiring 503.

Particularly, in the semiconductor memory device 300 shown in FIG. 4, from the decoder circuit BSD 41 (NAND circuit constituted by NMOS transistors to which the address signals AiIN and AjIN are input) that provides the selection signal to the memory block 310 disposed at the nearest distance from the control circuit block 301, the inverter 405 with the output of the decoder circuit BSD 41 as an input signal, the decoder circuit BSD 42 with the address signals /Ai and AjIN as input, which provides the selection signal to the memory block 320, the inverter 406 with the output of the decoder circuit BSD 42 as an input signal, the decoder circuit BSD 43 with the address signals AiIN and /Aj as input, which provides the selection signal to the memory block 330, the inverter 407 with the output of the decoder circuit BSD 43 as an input signal, the decoder circuit BSD 44 with the address signals /Ai and /Aj as input, which provides the selection signal to the memory block 340, and the inverter 408 with the output of the decoder circuit BSD 44 as an input signal are sequentially disposed within the control circuit block 301.

Note that, in the semiconductor memory device in the embodiment, the memory block selection signal lines BS 31, BS 32, BS 33, and BS 34 that transmit the memory block selection signals to the respective memory blocks are longer in proportion to the distances from the control circuit block 301 including the decoder circuits that generate memory block selection signals and the signal driver circuit to the respective memory blocks. On this account, the driving capabilities of the inverters that constitute the respective decoder circuits and the signal driver circuit is determined so as to be larger in proportion to the distances from the control circuit block 301 to the respective memory blocks. Therefore, in the decoder circuit BSD 44 and the inverter 408 that are connected to the memory block 340 at the farthest distance from the control circuit block 301, the areas of the active areas 501 and 502 of the transistors that constitute the decoder circuit BSD 44 and the inverter 408 are made larger than those of others and the gate widths of the transistors are made longer so that sufficient driving capabilities may be ensured. By the way, the driving capability of the decoder circuit is appropriately determined according to the gate load capacitance of the inverter with its output as the input signal.

As described above, according to the semiconductor memory device of the first embodiment in which the control circuit block 301 having the decoder circuits that generate memory block selection signals is disposed along the direction of the arrangement of the memory blocks disposed within the memory cell area 302 and adjacent to the memory cell area 302, the selection of the memory block including a desired memory cell and memory cell array can be performed by using one memory cell selection signal line.

As the result, the address signals are externally input, and the number of the operating signal lines when operating the semiconductor memory device can be reduced, and consequently, the current consumption can be reduced.

Further, according to the semiconductor memory device in which the selection of the memory block is performed by connecting one selection signal line to one memory block and supplying block selection signals via the signal line, the lengths of the memory block selection signal lines extending to the memory blocks can be determined according to the distances from the control circuit block 301 to the respective memory blocks. For example, for the case where the semiconductor memory device in which the lengths L of the respective memory blocks are 250 $\mu$m in the arrangement direction of the memory blocks 310, 320, 330, and 340, and the number of the memory blocks included in the memory cell area 302 is four, the length of the memory block selection signal line BS 31 extending to the memory block 310 at the nearest distance from the control circuit block 301 can be made on the order of one third of the conventional wiring length of the signal line in the address signal Ai, which extends from the control circuit block to the memory block. In the semiconductor memory device in the embodiment, the respective wiring lengths are approximately as follows, BS 31: 250 $\mu$m; BS 32: 500 $\mu$m; BS 33: 750 $\mu$m; and BS 34: 1000 $\mu$m.

Thus, by gradually reducing the wiring lengths from the memory block selection signal line BS 4 connected to the farthest memory block 340 so that the length of the memory block selection signal line BS 31 connected to the memory block 310 at the nearest distance may be the shortest, the parasitic capacitance in the wiring length direction that the respective memory block selection signal lines have can be reduced. That is, the semiconductor memory device that operates with low current consumption can be provided.

In addition, according to the semiconductor memory device in the embodiment, for example, since the length of the wiring of the memory block selection signal line BS 31, which extends to the memory block 310 at the nearest distance from the control circuit block 301, can be reduced, it is unnecessary that the driving capability of the signal driver circuit 405 that transmits the memory block selection signal to the memory block 310 and the decoder circuit BSD 31 that outputs the block selection signal are made larger. That is, the respective circuits can be constituted by transistors of small dimensions, and the layout area of the control circuit block can be made smaller.

Note that, in the embodiment, the decoder circuit BSD that generates the memory block selection signal is described by taking an NAND circuit having the circuitry in which NMOS transistors with high driving capability are connected in series and PMOS transistors having lower driving capability than the NMOS transistors are connected in parallel as an example, and the signal driver circuit 304 is described by taking the inverter constituted by the PMOS transistors and the NMOS transistors as an example, however, not limited to those but circuits capable of realizing the same operation. However, it is more preferable that the decoder circuit BSD is realized by using the NAND circuit in which the NMOS transistors with high driving capability are connected in series compared with a decoder circuit of an NOR circuit, for example, in which the PMOS transistors having lower driving capability than the NMOS transistors are connected in series, because a desired semiconductor memory device can be constructed in a smaller layout area.

What is claimed is:

1. A semiconductor memory device comprising:
   a plurality of memory blocks;
   a plurality of signal lines respectively connected to said memory blocks; and
   a control circuit connected to said signal lines, said control circuit including a plurality of selection signal generator circuits generating a plurality of generating selection signals for selecting one of said memory blocks by an externally input address signal and for outputting said selection signals to said signal lines,
   wherein lengths of the signal lines from said selection signal generator circuits to the respective memory blocks are longer in proportion to distances from said control circuit to said memory blocks, and
   wherein driving capabilities of said selection signal generator circuits are larger in proportion to the distances from said control circuit to said memory blocks.

2. A semiconductor memory device according to claim 1, wherein differences between driving capabilities of said selection signal generator circuits are determined by ratios of lengths of said signal lines connected to said control circuit.

3. A semiconductor memory device according to claim 1, wherein said control circuit further includes a signal driver circuit for transmitting said selection signals to the respective memory blocks.

4. A semiconductor memory device according to claim 3, wherein driving capability of said signal driver circuit is larger in proportion to the distances from said control circuit to said memory blocks.

5. A semiconductor memory device according to claim 3, wherein gate widths of transistors that constitute said signal driver circuit are longer in proportion to the distances from said control circuit to said memory blocks.

6. A semiconductor memory device according to claim 3, wherein said signal driver circuit is constituted by inverters with output of said selection signal generator circuits as input.

7. A semiconductor memory device comprising:
   a plurality of memory blocks;
   a plurality of signal lines respectively connected to said memory blocks; and
   a control circuit connected to said signal lines, said control circuit including a plurality of selection signal generator circuits generating a plurality of generating selection signals for selecting one of said memory blocks by an externally input address signal and for outputting said selection signals to said signal lines,
   wherein lengths of the signal lines from said selection signal generator circuits to the respective memory blocks are longer in proportion to distances from said control circuit to said memory blocks, and
   wherein gate widths of transistors that constitute said selection signal generator circuits are longer in proportion to the distances from said control circuit to said memory blocks.

8. A semiconductor memory device according to claim 7, wherein differences between the gate widths of transistors that constitute said selection signal generator circuits are determined by ratios of lengths of said signal lines connected to said control circuit.

9. A semiconductor memory device according to claim 7, wherein said control circuit further includes a signal driver circuit for transmitting said selection signals to the respective memory blocks.

10. A semiconductor memory device according to claim 9, wherein driving capability of said signal driver circuit is larger in proportion to the distances from said control circuit to said memory blocks.

11. A semiconductor memory device according to claim 9, wherein gate widths of transistors that constitute said signal driver circuit are longer in proportion to the distances from said control circuit to said memory blocks.

12. A semiconductor memory device according to claim 9, wherein said signal driver circuit is constituted by inverters with output of said selection signal generator circuits as input.

13. A semiconductor memory device comprising:
    a plurality of memory blocks;
    a plurality of signal lines respectively connected to said memory blocks; and
    a control circuit connected to said signal lines, said control circuit including a plurality of selection signal generator circuits generating a plurality of generating selection signals for selecting one of said memory blocks by an externally input address signal and for outputting said selection signals to said signal lines,
    wherein lengths of the signal lines from said selection signal generator circuits to the respective memory blocks are longer in proportion to distances from said control circuit to said memory blocks, and
    wherein said selection signal generator circuits are constituted by NAND circuits with said address signals as input.

14. A semiconductor memory device according to claim 13, wherein said control circuit further includes a signal driver circuit for transmitting said selection signals to the respective memory blocks.

15. A semiconductor memory device according to claim 14, wherein driving capability of said signal driver circuit is larger in proportion to the distances from said control circuit to said memory blocks.

16. A semiconductor memory device according to claim 14, wherein gate widths of transistors that constitute said signal driver circuit are longer in proportion to the distances from said control circuit to said memory blocks.

17. A semiconductor memory device according to claim 14, wherein said signal driver circuit is constituted by inverters with output of said selection signal generator circuits as input.

18. A semiconductor memory device comprising:
   a plurality of memory blocks disposed along a first direction;
   a plurality of signal lines respectively connected to said memory blocks; and
   a control circuit disposed apart from said memory blocks along said first direction and connected to said signal lines, said control circuit including a plurality of selection signal generator circuits generating a plurality of selection signals for selecting one of said memory blocks by an externally input address signal and for outputting said selection signals to said signal lines,
   wherein lengths of said signal lines from said selection signal generator circuits to the respective memory blocks are longer in proportion to distances from said control circuit to said memory blocks, and
   wherein driving capabilities of said selection signal generator circuits are larger in proportion to the distances from said control circuit to said memory blocks.

19. A semiconductor memory device according to claim 18, wherein said control circuit further includes a signal driver circuit for transmitting said selection signals to the respective memory blocks.

20. A semiconductor memory device according to claim 19, wherein driving capability of said signal driver circuit is larger in proportion to the distances from said control circuit to said memory blocks.

21. A semiconductor memory device according to claim 19, wherein gate widths of transistors that constitute said signal driver circuit are longer in proportion to the distances from said control circuit to said memory blocks.

22. A semiconductor memory device according to claim 19, wherein said signal driver circuit is constituted by inverters with output of said selection signal generator circuits as input.

* * * * *